United States Patent
Lacombe

(10) Patent No.: US 6,400,190 B1
(45) Date of Patent: Jun. 4, 2002

(54) CONTROLLED CURRENT UNDERSHOOT CIRCUIT

(75) Inventor: David K. Lacombe, Mission Viejo, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/306,707

(22) Filed: May 7, 1999

(51) Int. Cl.[7] .................................................. H03B 1/00
(52) U.S. Cl. ........................ 327/110; 327/423; 327/588; 360/68
(58) Field of Search .......................... 327/108–112, 423, 327/424, 588; 360/46, 67, 68

(56) References Cited

U.S. PATENT DOCUMENTS

| | | | | |
|---|---|---|---|---|
| 3,731,004 A | * | 5/1973 | Cowpland et al. | 327/108 |
| 3,770,986 A | * | 11/1973 | Drehle | 327/110 |
| 5,287,231 A | | 2/1994 | Shier et al. | 360/68 |
| 5,291,347 A | * | 3/1994 | Ngo et al. | 360/68 |
| 5,296,975 A | | 3/1994 | Contreras et al. | 360/68 |
| 5,309,347 A | * | 5/1994 | Poma et al. | 327/423 |
| 5,386,328 A | * | 1/1995 | Chiou et al. | 360/68 |
| 5,469,095 A | * | 11/1995 | Peppiette et al. | 327/110 |
| 5,550,502 A | * | 8/1996 | Aranovsky | 327/110 |
| 5,612,828 A | | 3/1997 | Brannon et al. | 360/68 |
| 5,631,595 A | * | 5/1997 | Lakshmikumar | 327/110 |
| 5,638,012 A | * | 6/1997 | Hashimoto et al. | 327/110 |
| 5,751,171 A | * | 5/1998 | Ngo | 327/110 |
| 5,770,946 A | | 6/1998 | Patterson | 327/110 |
| 5,781,046 A | * | 7/1998 | Ngo et al. | 327/110 |
| 5,822,141 A | | 10/1998 | Chung et al. | 360/68 |
| 5,859,519 A | * | 1/1999 | Archer | 363/41 |
| 5,880,626 A | * | 3/1999 | Dean | 327/110 |
| 6,133,768 A | * | 10/2000 | Price et al. | 327/110 |
| 6,184,727 B1 | * | 2/2001 | Price, Jr. | 327/108 |
| 6,297,921 B1 | * | 10/2001 | Price, Jr. et al. | 360/68 |

* cited by examiner

Primary Examiner—Terry D. Cunningham
Assistant Examiner—Long Nguyen
(74) Attorney, Agent, or Firm—W. Daniel Swayze, Jr.; W. James Brady; Frederick J. Telecky, Jr.

(57) ABSTRACT

A write driver to supply current to an induction load, including an H-bridge circuit coupled to the induction load to switch the current between a first current path and a second current path, said induction load operative to generate an undershoot current, and an undershoot circuit to control the undershoot current based on a comparison of a reference voltage and a flyback voltage. The undershoot circuit is connected to bases of the transistors of the lower H-bridge circuit.

3 Claims, 5 Drawing Sheets

CONTROLLED CURRENT UNDERSHOOT CIRCUIT

FIELD OF THE INVENTION

The present invention relates to write drivers for an inductive head in a magnetic data storage system and more particularly to a method of accurately controlling a write driver's current response by means of a circuit connected to an H-bridge to control current undershoot.

BACKGROUND OF THE INVENTION

Conventional storage systems include an inductive coil to write information onto a recording surface of the magnetic medium, such as a magnetic disk. The inductive coil writes information by creating a changing magnetic field near the magnetic medium. A write driver circuit is connected to the inductive coil at two terminals. During writing operations, the write driver circuit forces a relatively large current through the inductive is coil to create a magnetic field that polarizes adjacent bit positions on the recording surface. Digital information is stored by reversing the polarization of selected bit positions which is done by reversing the direction of the current flow in the inductive coil.

The typical write driver circuit includes an "H-bridge" for controlling the direction of current flow through the inductive coil. The H-bridge includes upper "pull-up" bipolar transistors and lower "pull-down" bipolar transistors. The upper bipolar transistors are connected between a first supply voltage and the inductive coil terminals. The lower bipolar transistors are connected between another set of inductive coil terminals and a second supply voltage through a write current sink. The write driver circuit controls the direction of flow through the inductive coil by driving selected transistors in the H-bridge between ON and OFF states, thereby applying a limited voltage swing across the inductive coil to reverse the coil's current flow and to polarize the adjacent bit position on the magnetic medium.

The rate at which information can be stored on a recording surface through an inductive head is directly proportional to the rate at which the direction of current can be reversed in the inductive coil. The rise/fall time of the inductive coil is determined by:

$$di/dt = V/L$$

where di/dt is the rate of change of the current over time through the inductive coil, V is the available voltage across the inductive coil, and L is the inductive load. Therefore, the rate of current change through the coil is directly proportional to the available voltage across the inductive coil. The available voltage is determined by subtracting the voltage drops across the H-bridge pull-up transistors, the pull-down transistors, and the write current sink from the supply voltage.

In addition to the rate of current change through the coil, there are other coil current attributes that will affect how magnetic transitions are written to the medium. Some important coil current characteristics are shown in FIG. 7. In particular, the current's rise time (rate of change), overshoot, undershoot, and settling time are of interest. The desired characteristics for the coil current are a fast rise time and settling time, a controllable amount of overshoot, and very little undershoot.

When the H-bridge switches the direction of current through the coil, a "flyback" voltage is produced on the current sourcing side of the H-bridge. A coil current undershoot results from this flyback voltage. The flyback voltage can be used to determine when the H-bridge current source should be compensated to reduce the coil current undershoot.

SUMMARY OF THE INVENTION

The write driver circuit of the present invention accurately controls the current through the coil that is used to write data to the magnetic medium.

The present invention provides an undershoot circuit to accurately adjust the amount and duration of coil current undershoot over a wide range of write current settings and undershoot current settings.

This invention compares the flyback voltage of the coil to determine when a compensation current should be applied to reduce the coil current undershoot. By using the flyback voltage, the compensation circuit can turn on precisely when the undershoot compensation is needed.

Furthermore, because the undershoot is controlled at the base of the bottom of the H-bridge circuit, the undershoot circuit of the present invention requires little power dissipation and adds little parasitic capacitance to the H-bridge.

DETAILED DESCRIPTION OF THE PRESENT INVENTION

The following invention is described with reference to the figures in which similar or the same numbers represent the same or similar elements. While this invention is described in terms for achieving the invention's objectives, it can be appreciated by those skilled in the art that variations may be accomplished in view of these teachings without deviation from the spirit or scope of the invention.

Figure 1:
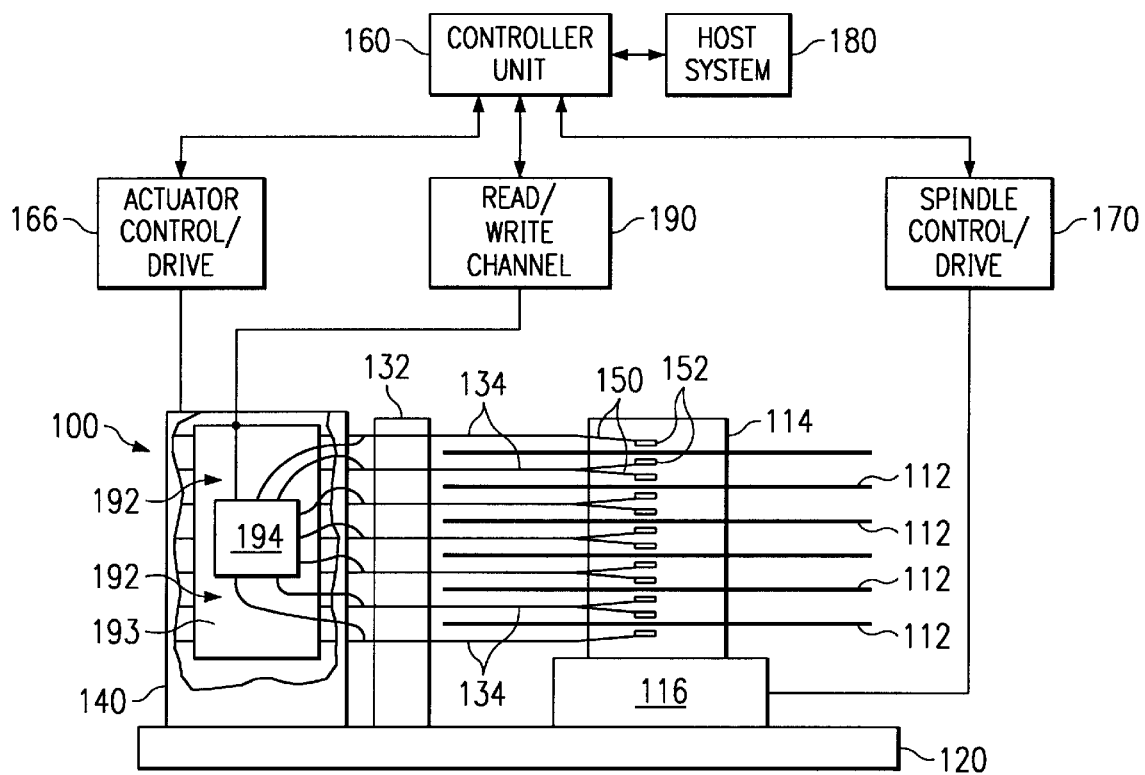
FIG. 1 is a side view of the disk drive system.
Figure 2:
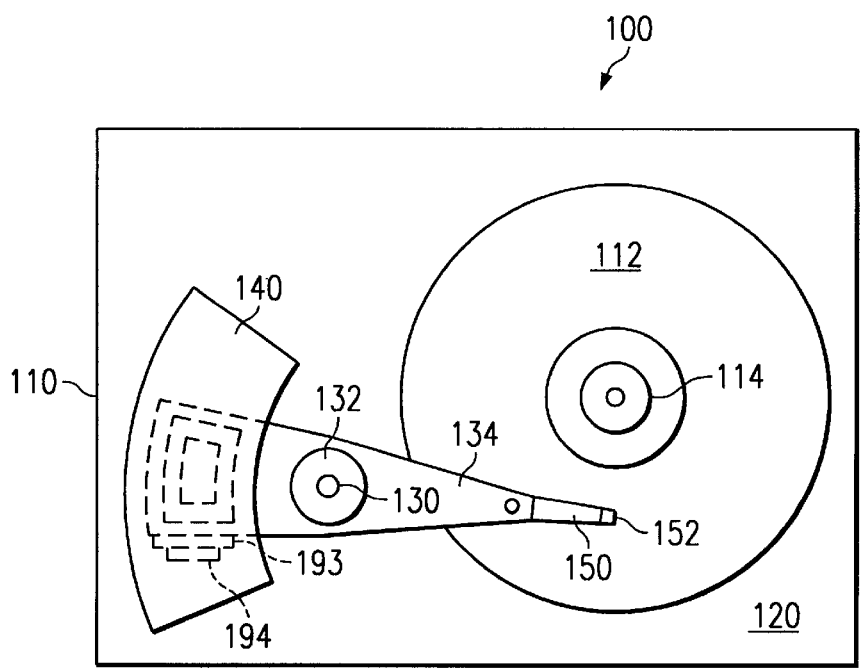
FIG. 2 is a top view of the disk drive system.

FIGS. 1 and 2 show a side and top view, respectively, of the disk drive system designated by the general reference 100 within an enclosure 110. The disk drive system 100 includes a plurality of stacked magnetic recording disks 112 mounted to a spindle 114. The disks 112 may be conventional particulate or thin film recording disk or, in other embodiments, they may be liquid-bearing disks. The spindle 114 is attached to a spindle motor 116 which rotates the spindle 114 and disks 112. A chassis 120 is connected to the enclosure 110, providing stable mechanical support for the disk drive system. The spindle motor 116 and the actuator shaft 130 are attached to the chassis 120. A hub assembly 132 rotates about the actuator shaft 130 and supports a plurality of actuator arms 134. The stack of actuator arms 134 is sometimes referred to as a "comb." A rotary voice coil motor 140 is attached to chassis 120 and to a rear portion of the actuator arms 134.

A plurality of head suspension assemblies 150 are attached to the actuator arms 134. A plurality of inductive transducer heads 152 are attached respectively to the suspension assemblies 150, each head 152 including at least one inductive write element. In addition thereto, each head 152 may also include an inductive read element or a MR (magneto-resistive) read element. The heads 152 are positioned proximate to the disks 112 by the suspension assemblies 150 so that during operation, the heads are in electromagnetic communication with the disks 112. The rotary voice coil motor 140 rotates the actuator arms 134 about the actuator shaft 130 in order to move the head suspension assemblies 150 to the desired radial position on disks 112.

A controller unit 160 provides overall control to the disk drive system 100, including rotation control of the disks 112 and position control of the heads 152. The controller unit 160 typically includes (not shown) a central processing unit (CPU), a memory unit and other digital circuitry, although it should be apparent that these aspects could also be enabled as hardware logic by one skilled in the computer arts. Controller unit 160 is connected to the actuator control/drive unit 166 which is in turn connected to the rotary voice coil motor 140. A host system 180, typically a computer system or personal computer (PC), is connected to the controller unit 160. The host system 180 may send digital data to the controller unit 160 to be stored on the disks, or it may request that digital data at a specified location be read from the disks 112 and sent back to the host system 180. A read/write channel 190 is coupled to receive and condition read and write signals generated by the controller unit 160 and communicate them to an arm electronics (AE) unit shown generally at 192 through a cut-away portion of the voice coil motor 140. The AE unit 192 includes a printed circuit board 193, or a flexible carrier, mounted on the actuator arms 134 or in close proximity thereto, and an AE module 194 mounted on the printed circuit board 193 or carrier that comprises circuitry preferably implemented in an integrated circuit (IC) chip including read drivers, write drivers, and associated control circuitry. The AE module 194 is coupled via connections in the printed circuit board to the read/write channel 190 and also to each read head and each write head in the plurality of heads 152. The AE module 194 includes the write driver circuit of the present invention.

Figure 7:
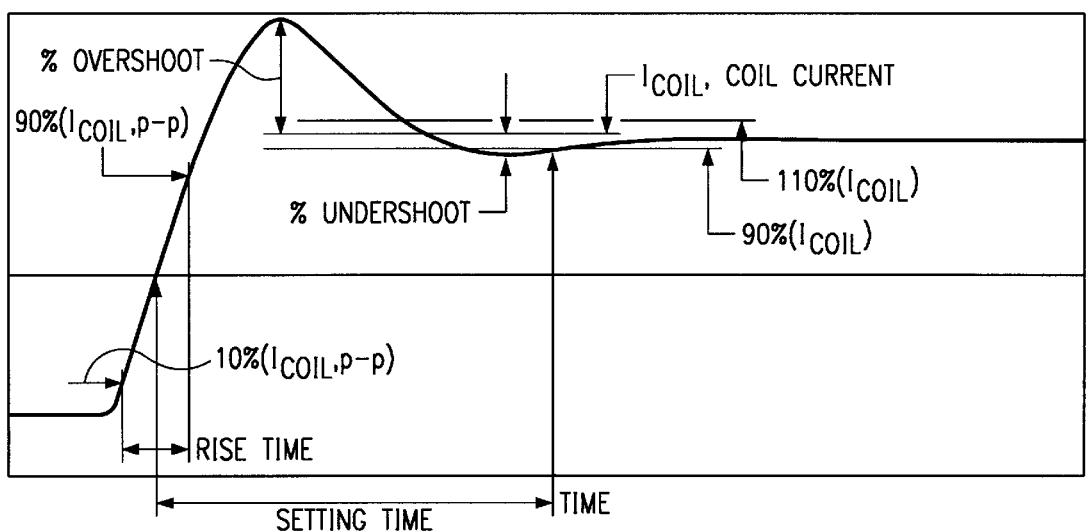
FIG. 7 is a diagram of coil current waveform characteristics.

FIG. 7 shows a plot of the important characteristics of the inductive coil current waveform. The y-axis of the plot is current magnitude and the x-axis is time. The desired characteristics are a fast rise time, a fast settling time, a controllable amount of current overshoot, and very little current undershoot. The percentages denoted below are typical. The current rise time is defined as the time required to change the coil current from 10% of the steady state peak-to-peak magnitude to 90% of the steady state peak-to-peak magnitude. The settling time is defined as the time when the coil current switches from 50% of the steady state peak-to-peak magnitude to the time the current settles or is confined within a window bounded by 90% of the steady state coil current to 110% of the steady state current. The coil current overshoot is defined as a percentage of the (peak coil current—steady state coil current)÷steady state coil current. The coil current undershoot is defined as a percentage of the [(magnitude of the current trough after the peak current)—steady state coil current)]÷steady state coil current.

Figure 3:
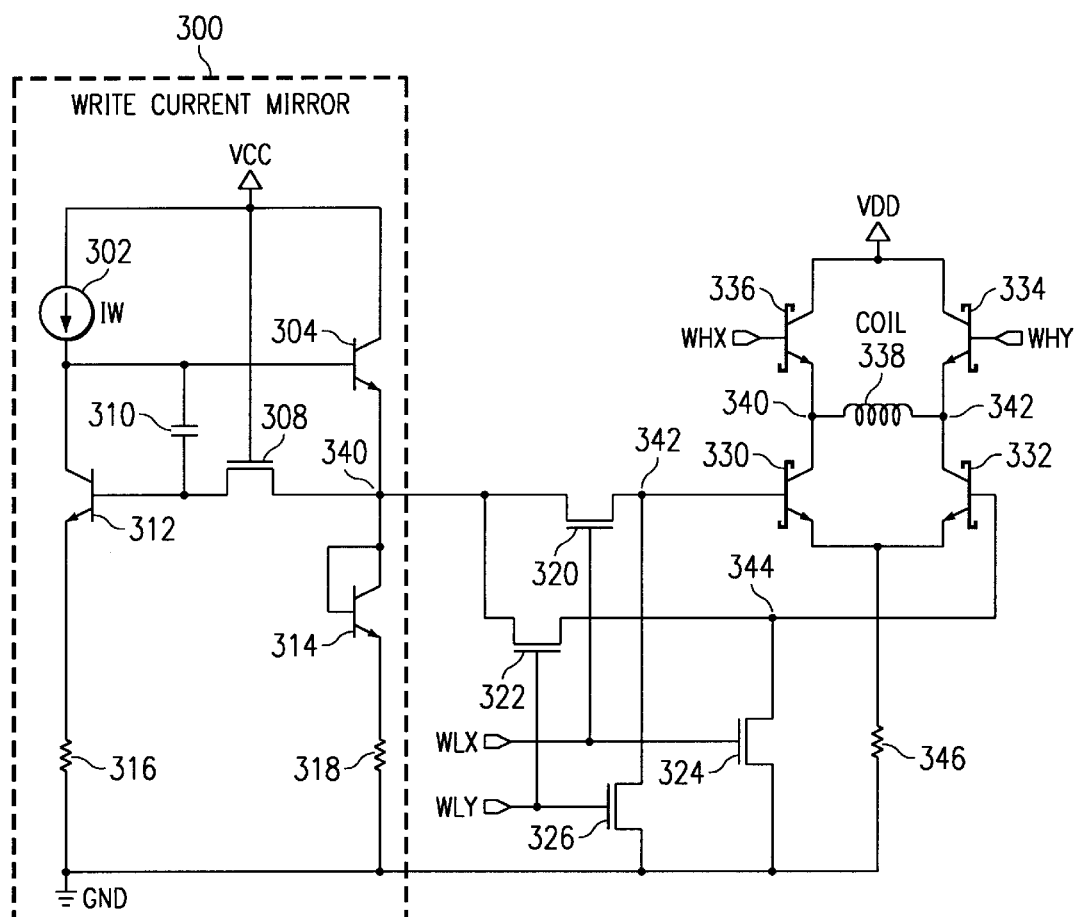
FIG. 3 is a circuit diagram of a write driver.

In FIG. 3, transistor 330, transistor 332, transistor 334, and transistor 336 form an H-bridge switch. The coil 338 is activated by current flowing through it which forms magnetic transitions on the disk. The current through the coil 338 can be switched in either direction by turning off or on the appropriate transistors. When transistor 336 and transistor 332 are turned on, current will flow through coil 338 from node 340 to node 342. Under this situation, transistor 334 and transistor 330 are turned off. To change is the direction of the current through the coil from node 342 to node 340, transistor 336 and transistor 332 are turned off, and transistor 334 and transistor 330 are turned on. These transistors are controlled by write data signals, namely WHX, WHY, WLX and WLY. The steady state coil current is determined by the write current mirror circuit 300. The write current mirror circuit 300 includes transistor 312, resistor 316, transistor 304, FET 308, capacitor 310, transistor 314, and resistor 318. A voltage at node 340 is dependent on the current IW. This current IW is adjustable, and consequently, the voltage at node 340 is adjustable. Node 340 is connected to NFET 320, which is connected to node 342. Likewise, node 340 is connected to NFET 322, which is in turn connected to node 344. The NFET 320 and NFET 322 are switches and are complementary in that only one NFET (either NFET 320 or NFET 322) is on at any one time. When NFET 320 is turned on, the voltage at node 340 is approximately the same as at node 342, the transistor 330 is turned on by the voltage at node 342, and the current $I_{COIL}$ flows through resistor 346. The coil current $I_{COIL}$ is the amplified current of the master current IW. The typical gain is approximately 20.

The emitter size ratio of transistors 330, 332, and 312 and the resistor size ratio of resistors 316 and 346 determine the gain of the circuit from the write current mirror circuit 300. The coil current $I_{COIL}$ is an amplified current of the master current IW. When the NFET 320 is turned on and the NFET 322 is off, the voltage at node 340 is approximately the voltage at node 342. Therefore, transistor 330 is on, and transistor 332 is off. At the same time that NFET 320 turns on, the signal WHY turns on transistor 334 and signal WHX turns off transistor 336. The circuitry that controls transistor 336 and transistor 334 is not shown. Of interest with the present invention is the lower H-bridge transistors, namely transistors 330 and 332.

Typically, NFET 320 and NFET 322 are very large, so consequently, the impedance between nodes 340 and 342 or node 344 is minimized. A small impedance will turn transistor 330 and transistor 332 on faster; however, the gate to drain and source capacitance is high. When either NFET 320 or NFET 322 is turned on, the gate voltage goes high, dumping charge into the base of transistor 330 or transistor 332 through the NFET's parasitic capacitance. This extra "boost" of charge is amplified by transistor 330 or transistor 332 and results in excessive coil current overshoot. Furthermore, the NFET switches, namely NFET 320 and NFET 322, are not controlled by differential signals. Thus, the timing of the gate voltage is dependent on circuit layout. An asymmetric layout of signals WLX and WLY to NFET 320 or NFET 322 could cause NFET 320 and NFET 322 to turn on or off uncomplementary. As a result, the load seen by the write current mirror circuit, particularly at node 340, will change, resulting in the voltage at node 340 changing. The compensation due to capacitor 310 of the write current mirror circuit 300 is important. If the circuit 300 is not well compensated, the voltage at node 340 will change which results in an undesirable current response. Typically, the current through the coil 338 is a multiple of the master current IW with a typical gain of 20. Signals WLX and WLY are CMOS level signals to control NFET 320 and NFET 322. Since the signals are not completely differential, this leads to asymmetrical switching between NFET 320 and NFET 322.

Figure 4:
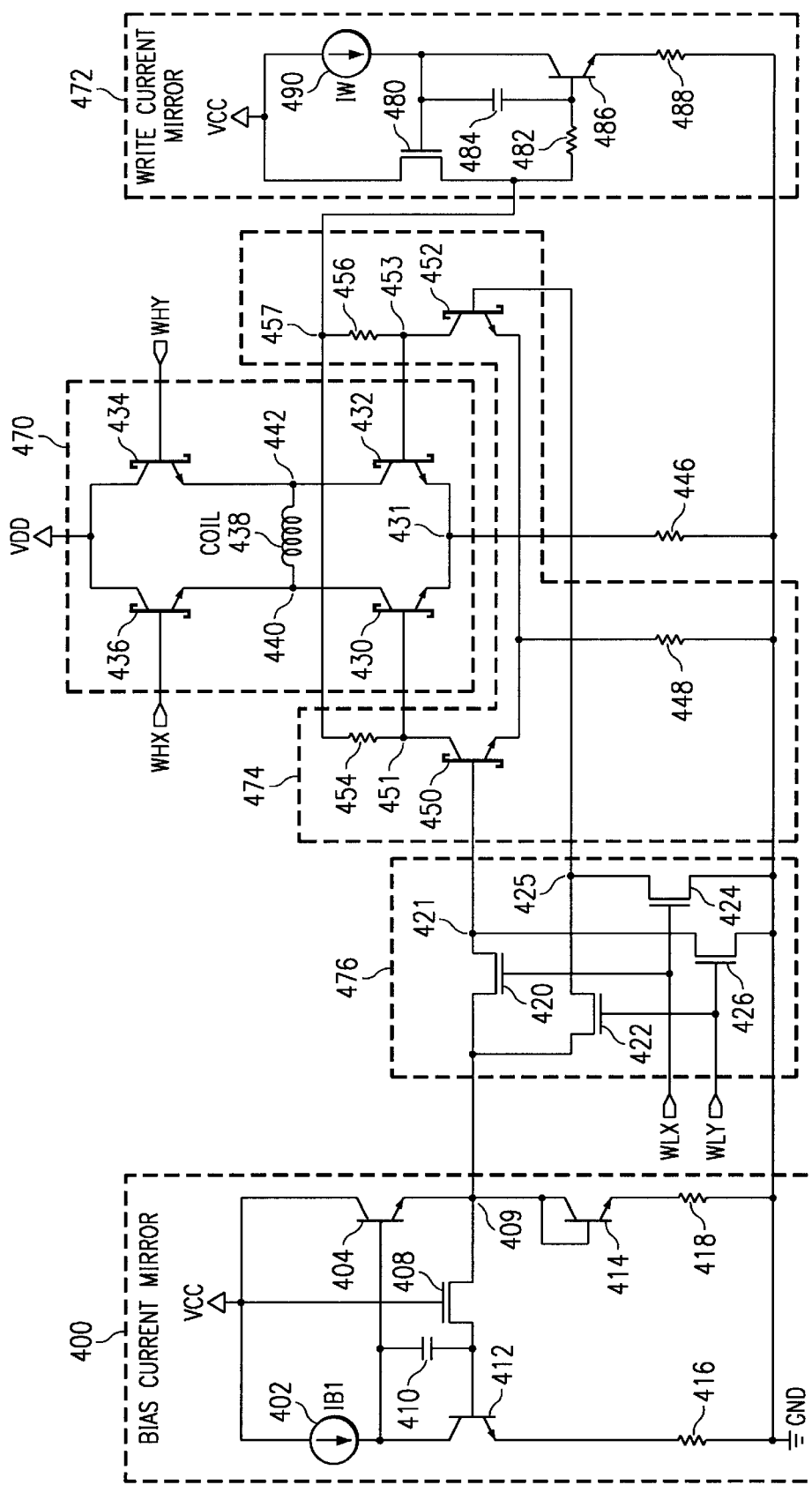
FIG. 4 is a circuit diagram of a write driver in accordance with the present invention.

Turning now to FIG. 4, FIG. 4 illustrates an H-bridge circuit 470. The bias current mirror circuit 400 provides bias current to the H-bridge differential pair switch, transistor 450, transistor 452 and resistor 448. Current source 402 is connected to the collector of transistor 412. Additionally, the output of current generator 402 is connected to capacitor 410 and the base of transistor 404. The collector of transistor 404 is connected to the voltage $V_{CC}$. The emitter of transistor 412 is connected to resistor 416, and the base of transistor 412 is connected to capacitor 410 and the source of NFET 408. The gate of NFET 408 is connected to voltage $V_{CC}$ while the drain of NFET 408 is connected to the emitter of transistor 404 and the base and collector of transistor 414. The emitter of transistor 414 is connected to resistor 418. Both resistors 416 and 418 are connected to ground.

The differential pair switch circuit 474 includes transistor 450 and transistor 452, resistor 454, resistor 456, and resistor 448. The resistors 454 and 456 are connected together at the output of the write current mirror circuit 472. The resistor 454 is connected to the collector of transistor 450. The base of transistor 450 is connected to the drain of NFET 420. The emitter of transistor 450 is connected to resistor 448 and connected to the emitter of transistor 452. The base of transistor 452 is connected to the drain of NFET 422. The collector of transistor 452 is connected to resistor 456. The differential pair switch circuit 474 turns on and off the lower H-bridge transistors of H-bridge circuit 470. More specifically, transistor 430 and transistor 432 are turned on and off by the differential pair switch circuit 474. The H-bridge circuit 470 includes four transistors, namely transistors 430 and 432, which are the lower transistors of the H-bridge circuit 470. Additionally, the H-bridge circuit 470 includes upper transistors, namely transistors 436 and 434. Additionally, the H-bridge circuit includes a coil 438 connected between the emitters of transistor 436 and transistor 434 and across the collector of transistor 430 and transistor 432. The emitters of transistors 430 and 432 are connected together and connected to resistor 446. The collector of transistor 436 is connected to voltage $V_{DD}$ while the collector of transistor 434 is connected to voltage $V_{DD}$. A switch circuit 476 includes four NFET switches to switch the bias current from the bias current mirror circuit 400 to the differential pair switch circuit 474. The switch circuit 476 includes NFET 422, NFET 420, NFET 424 and NFET 426. A write current mirror circuit 472 is used to set up the coil current. The circuit includes NFET 480 having a drain connected to voltage $V_{CC}$. The gate of NFET 480 is connected to capacitor 484 and to the output of write current reference 490. The source of transistor 480 is connected to resistor 482, and the other end of resistor 482 is connected to capacitor 484. Additionally, resistor 482 is connected to the base of transistor 486. The collector of transistor 486 is connected to the output of current source 490. The emitter of transistor 486 is connected to resistor 488, and the other end of resistor 488 is connected to ground.

The circuit of FIG. 4 operates as follows. The output of bias current mirror circuit 400 is at node 409. Node 409 is connected to two switches, represented by NFET 420 or NFET 422. NFET 420 and NFET 422 can be relatively small because they drive the bases-of a low-current differential pair of transistors, namely transistor 450 and transistor 452. If NFET 420 is on, NFET 422 will be off, and node 409 will be connected to node 421 through NFET 420. Node 425 will be grounded because NFET 424 will be turned on. The voltage potential at node 421 is greater than the voltage potential at node 425, and therefore, transistor 450 is turned on and transistor 452 is off. Transistor 450 and transistor 452 are connected as a differential pair. The bias current of the differential pair is set by the current mirror configuration of transistor 412, transistor 450, and resistance 416 and resistance 448.

The bias current of the differential pair of transistor 450 and transistor 452 is set by the ratio of transistor 412 and transistor 450, and resistor 416 and resistor 448. The transistors 430 and 432 of the H-bridge circuit 470 are turned on and off by the potential difference between node 451 and node 453. This potential difference between nodes 451 and 453 can be quite small on the order of approximately 300 mV to fully turn on and off the H-bridge transistors 430 and 432.

The small potential difference now required to turn on and turn off transistors 430 and 432 decreases the slew rate required to control the H-bridge transistors, and consequently, the circuit speed of H-bridge circuit 470 is significantly improved. Transistor 450 and transistor 452 are a differential pair of transistors, and consequently, when the voltage at node 453 is higher than the voltage at node 451, transistor 432 will be on and transistor 430 will be off. The resistors 454 and 456 are connected to a common node point, namely node 457. The potential at node 451 is made lower than node 453 when transistor 450 is turned on and the bias current flows through resistance 454. The voltage at node 451, $V_{node451} = V_{node457} - [I_{RESISTANCE448} \times \text{resistance } 454]$.

Since transistor 452 is off, the voltage of node 453 is close to node 457 since the only voltage drop between node 453 and node 457 across resistance 456 is from the base current of transistor 432. The voltage at node 457 is derived from the write current mirror from the output of the write current mirror circuit 472. In particular, the output is derived by transistor 486, NFET 480, resistance 482, resistance 488, and capacitor 484. Resistor 482 in the write current mirror circuit 472 offsets the output voltage of the write current mirror circuit 472 at node 457 to account for the base current drop across resistance 456. The master current IW is mirrored through transistor 432 and resistance 446. The ratio of transistor 432 and transistor 486 and resistance 488 and 446 determines the coil current. The coil current is approximately equal to the current through resistance 446.

Because of the differential circuit formed by transistors 450 and 452, the voltage at nodes 451 and 453 can be controlled by sourcing or sinking current into these nodes. By changing the voltage at node 451 or node 453, the coil current can be accurately varied. One side of resistor 446 at node 431 is connected to the emitter of transistor 430 and transistor 432. The voltage at node 431 will follow the voltage at the base of the "on" transistor of the H-bridge circuit 470. In this case, the voltage at node 431 follows node 453. If the voltage at node 453 were to increase or decrease, then the voltage at node 431 would increase or decrease correspondingly. Furthermore, the coil current would increase or decrease. The ability to control the coil current by changing the voltage at node 451 and node 453 allows the circuit to control the coil current overshoot and undershoot.

Figure 5:
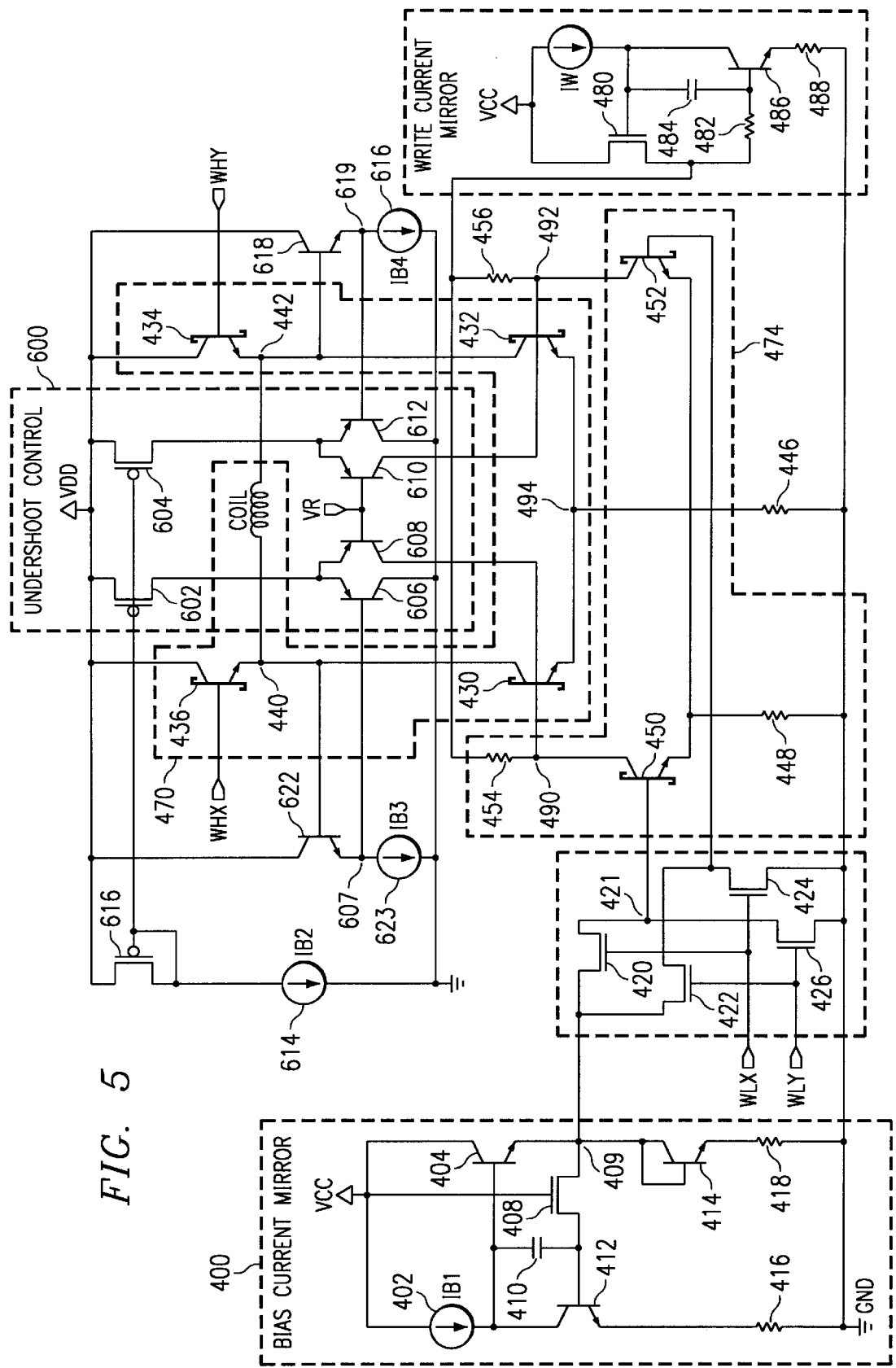
FIG. 5 is a circuit diagram of the write driver in accordance with the present invention.
Figure 6:
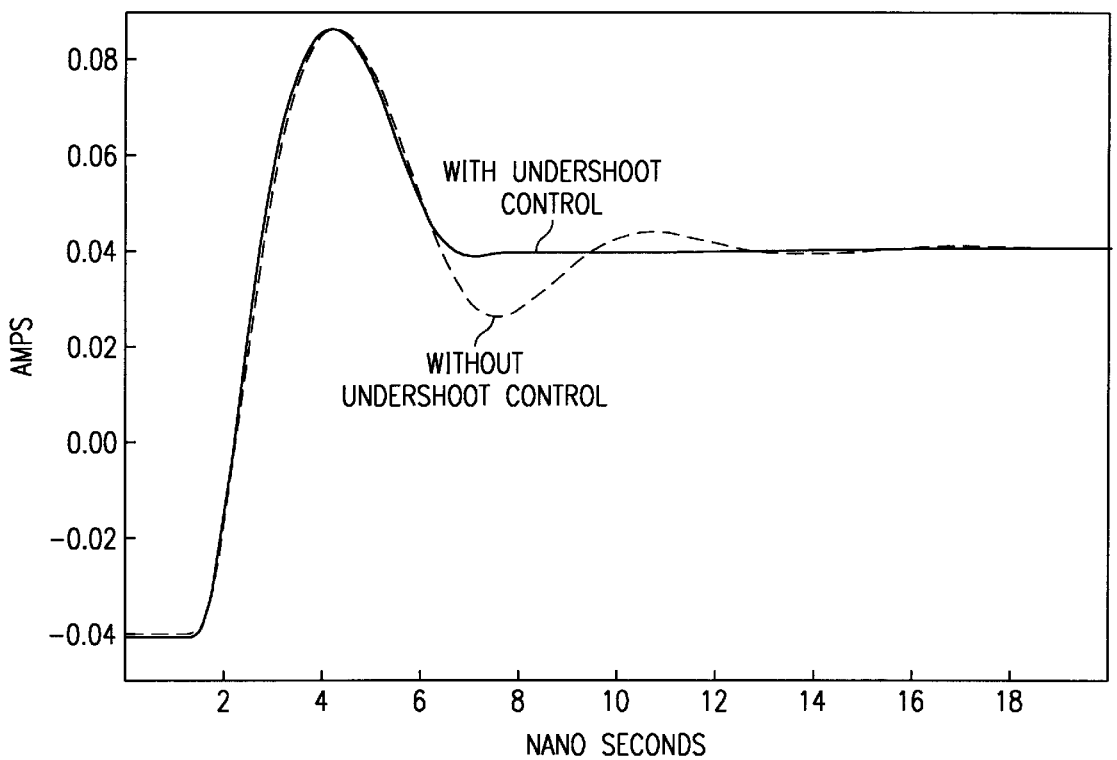
FIG. 6 is a diagram of current with and without undershoot control.

FIG. 5 illustrates the undershoot control circuit 600 of the present invention. The undershoot control circuit 600 includes PFET 602 having a source of PFET 602 connected to voltage source $V_{DD}$ with the drain of PFET 602. connected to the emitters of bipolar transistor 608 and transistor 606. The collector of transistor 606 is connected to ground with the base of transistor 606 connected to the emitter of transistor 622 at node 607. The collector of transistor 608 is connected to the base of transistor 430. The base of transistor 608 is connected to the voltage reference (VR). The voltage reference is programmable/adjustable.

Additionally, the undershoot control circuit 600 includes a PFET 604 having a source connected to voltage source $V_{DD}$ and a drain of PFET 604 connected to commonly connected emitters 610 and 612. The gate of PFET 604 is connected to the gate of PFET 602. The gate of PFET 602 is connected to the commonly connected gate and drain of PFET 616. The base of transistor 610 is connected to the voltage reference VR. The collector of transistor 610 is connected to the base of transistor 432. The collector of transistor 612 is connected to ground. The base of transistor 612 is connected to the emitter of transistor 618 at node 619. The base of transistor 618 is connected to the emitter of transistor 434 at node 442, and the collector of transistor 618 is connected to voltage $V_{DD}$. The emitter of transistor 618 is connected to the current source 616. The current source 616, which outputs a current IB1, is connected to ground. Additionally, PFET 616 has a source connected to voltage $V_{DD}$, and the gate and drain of PFET 616 is connected to current source 614. Current source 614 outputs a current IB2. The other end of current source 614 is connected to ground. The collector of transistor 622 is connected to voltage $V_{DD}$, and the base of transistor 622 is connected to the emitter of transistor 436 at node 440. The emitter of transistor 622 is connected to current source 623 while the other end of current source 623 is connected to ground. Current source 623 outputs a current IB3.

The undershoot control circuit 600 includes PFET 616, PFET 602, and PFET 604. Additionally, the undershoot control circuit 600 includes bipolar transistors 606, 608, 610 and 612. Furthermore, the undershoot control circuit 600 includes current source 614. In a steady state condition, assume that the coil current is flowing through the coil through transistor 436 to node 440 through the coil to node 442 to transistor 432. Under these circumstances, the H-bridge transistor 436 and transistor 432 will be on, with transistor 430 and transistor 434 turned off. Note, that when transistor 436 is on, the input signal WHX is approximately equal to the supply voltage $V_{DD}$. As explained, when transistor 430 turned is off, transistor 450 is turned on. Additionally, NFET 420 is on, and signal WLX is a logical "1." Also, when transistor 432 is turned on, transistor 452 is turned off. Additionally, NFET 422 is off, and signal WLY is a logical "0." The voltage at node 440 is approximately equal to WHX minus the voltage $V_{BE}$ of transistor 436 or approximately $V_{DD}$ minus $V_{BE}$ of transistor 436. If it is assumed that the coil resistance is approximately zero, then the voltage at the base of transistor 618 is equal to the voltage at the base of transistor 622. The voltages at the base of transistor 618 at node 442 and the voltage at the base of transistor 622 at node 440 are level shifted by emitter followers, namely transistor 622 and transistor 618, respectively.

Transistor 606, transistor 608, transistor 610, and transistor 612 form a comparator circuit. The voltage at node 607 is compared to the voltage reference VR by this comparator circuit, and the voltage at node 619 is compared to the voltage reference VR by this comparator circuit. The bias current for the transistor pairs 606/608 and 610/612 is provided by PFET 602 and PFET 604, respectively. The currents through PFET 602 and PFET 604 are current mirrored to PFET 616 which is biased by the current source 614 to output current IB2. At steady state, VR is chosen to be at a higher voltage than node 607 or node 619. Therefore, transistor 606 and transistor 612 are turned on, and the bias current is sent to ground. Since transistor 608 and transistor 610 are turned off, there is no current sourced to node 490 and node 492.

When the coil current direction is changed by changing signals, WLX, WLY, WHX and WHY, the current will flow from node 442 and from transistor 434 through the coil to node 440 and to transistor 430. Transistor 434 and transistor 430 will be turned on, with transistor 436 and transistor 432 turned off. Transistor 450 will be turned off, and transistor 452 will be turned on. The voltage at the base of transistor 622 at node 440 is driven momentarily towards ground because the coil current cannot change instantaneously. The voltage at the base of transistor 618 at node 442 is approximately equal to $V_{DD}$ minus $V_{BE}$ of transistor 434. Because the coil forms an LC tank circuit with the parasitic capacitance formed by the H-bridge transistors, transistors 434 and 436, the voltage at the base of transistor 622 at node 440 can "fly back" higher than the voltage at the base of transistor 618 at node 442. When this occurs, the coil current is reduced to less than the steady state current. This results in coil current undershoot.

During steady state, the steady state voltage at the base of transistor 622 at node 440 is equal to the voltage at the base of transistor 618 at node 442. When the coil current undershoots, the voltage at the base of transistor 622 at node 440 is higher no than the voltage at the base of transistor 618 at node 442. The voltage reference VR is chosen so the voltage at node 607 is greater than the voltage reference VR when the voltage at the base of transistor 622 at node 440 is slightly greater than the voltage at the base of transistor 618 at node 442. When the voltage at node 607 is greater than the voltage reference VR, transistor 608 turns on, and the differential current bias current from PFET 602 is sourced into the base of transistor 430 at node 490. The voltage at the base of transistor 430 at node 490 increases by an amount determined by I of PFET 602×the resistance of resistor 454. Since transistor 430 is turned on, the voltage at the common emitters of transistors 430 and 432 at node 494 follows the voltage at the base of transistor 430 at node 490. Therefore, the collector current of transistor 430 will increase by approximately the current through PFET 602×the resistance of resistor 454÷the resistance of resistor 446. This results in the coil current increasing which compensates for the current undershoot. The increased current of transistor 430 causes the voltage at the base of transistor 622 at node 440 and the voltage at the base of transistor 606 at node 607 to decrease until the voltage at the node 607 is less than the reference voltage.

The amount of current undershoot correction is determined by the following parameters: the voltage reference VR, the current through PFET 602, the resistance of resistor 454, and the resistance of resistor 446. With the present invention, the voltage VR was adjustable to get the desired undershoot response.

Examining the complementary side of the H-bridge circuit 470, transistor 434 and transistor 432, the voltage at the base of transistor 618 at node 442 should be approximately $V_{DD}-V_{BE}$ of transistor 434. Since the voltage at node 619 follows the voltage at node 442, the voltage at node 619 should be greater than the voltage reference VR. Therefore, transistor 612 is turned off, and transistor 610 is turned on. Also, since transistor 432 is off, transistor 452 is on. The current that flows through transistor 610, which is the current through PFET 604, is sourced into node 492 at the base of transistor 432. The voltage at the base of transistor 432 at node 492 is increased by the current through PFET 604×the resistance of resistor 456. However, the bias at current of transistor 452, which is set by the bias current mirror circuit 400, can be made sufficiently large enough so that when the voltage at the base of transistor 432 at node 492 increases, the voltage at the base of transistor 432 at node 492 will be lower than the base of transistor 430. Therefore, transistor 432 will remain off.

What is claimed is:

1. A write driver to supply current to an induction load, comprising:
   an H-bridge circuit coupled to said induction load to switch said current between a first current path and a second current path, said induction load operative to generate an undershoot current; and
   an undershoot circuit to control said undershoot current based on a programmable reference voltage; wherein said undershoot circuit compares the reference voltage to a flyback voltage.

2. A write driver to supply current to an induction load as in claim 1, wherein said H-bridge circuit includes an upper H-bridge circuit and a lower H-bridge circuit, said undershoot circuit is connected to said lower H-bridge circuit.

3. A write driver to supply current to an induction load as in claim 1, wherein said lower H-bridge circuit includes at least two transistors having bases connected to said undershoot circuit.

* * * * *